(12) United States Patent
Kim

(10) Patent No.: US 6,355,510 B1
(45) Date of Patent: Mar. 12, 2002

(54) METHOD FOR MANUFACTURING A THIN FILM TRANSISTOR FOR PROTECTING SOURCE AND DRAIN METAL LINES

(75) Inventor: Kee-Jong Kim, Anyang-shi (KR)

(73) Assignee: LG. Philips Lcd. Co. Ltd., Seoul (KR)

( * ) Notice: Subject to any disclaimer, the term of this patent is extended or adjusted under 35 U.S.C. 154(b) by 0 days.

(21) Appl. No.: 09/435,589

(22) Filed: Nov. 8, 1999

(30) Foreign Application Priority Data

Dec. 12, 1998 (KR) .............................................. 98-54619

(51) Int. Cl.[7] .......................... H01L 21/00; H01L 21/84
(52) U.S. Cl. ........................ 438/149; 438/161; 438/164
(58) Field of Search ................................ 438/149, 166, 438/151, 153, 154, 155, 161, 164, 618; 257/66, 67, 72, 347

(56) References Cited

U.S. PATENT DOCUMENTS 5,402,254 A * 3/1995 Sasano et al. ................. 349/38
5,913,113 A * 6/1999 Seo ............................. 438/166
6,040,589 A * 3/2000 Zhang et al. ................. 257/59

* cited by examiner

*Primary Examiner*—Olik Chaudhuri
*Assistant Examiner*—Theresa T. Doan
(74) *Attorney, Agent, or Firm*—Birch, Stewart, Kolasch & Birch, LLP

(57) ABSTRACT

A method for manufacturing a thin film transistor includes the step of forming a protective layer for protecting source and drain metal lines during a cleaning process. The protective layer is preferably made of silicon nitride and preferably has a thickness of less than about 2000 angstroms.

44 Claims, 4 Drawing Sheets

METHOD FOR MANUFACTURING A THIN FILM TRANSISTOR FOR PROTECTING SOURCE AND DRAIN METAL LINES

BACKGROUND OF THE INVENTION

1. Field of the Invention

The present invention relates to a method for manufacturing a thin film transistor and more specifically, the present invention relates to a method for manufacturing a thin film transistor having a protective layer arranged to protect source and drain metal lines when a substrate upon which the thin film transistor undergoes a cleaning process.

2. Description of the Background Art

FIGS. 1A–1D are cross-sectional views illustrating a process for manufacturing a thin film transistor according to the related art.

Referring to FIG. 1A, source and drain metal lines are formed on an insulating substrate 100. The source metal line is defined by a double-layered laminate of a first source metal line 11S and a second source metal line 12S. The drain metal line is defined by a double-layered laminate of a first drain metal line 11D and a second drain metal line 12D. A low resistance metal such as aluminum (Al) is used to form the first and second source metal lines 11S and 12S. Using a low resistance metal for the source metal lines allows for faster signal transmission in a device where the thin film transistor is used, for example, in a liquid crystal display device.

Referring to FIG. 1B, a buffer layer and an amorphous silicon layer are sequentially deposited to cover the exposed portion of the substrate 100. Thereafter, the amorphous silicon layer is crystallized into a polysilicon layer and then patterned and etched to form an active layer 14. The underlying buffer layer 13 is then etched with the active layer 14 functioning as a mask.

Referring to FIG. 1C, a gate insulating layer and a conductive layer are sequentially deposited on the exposed portion of the substrate 100 and the active layer 14. The conductive layer is patterned and etched to form a gate electrode 16. Next, the gate insulating layer 15 is etched with the gate electrode 16 functioning as a mask.

Thereafter, select portions within the active layer 14 are doped with impurities to define a source region 14S and a drain region 14D. A channel region 14C located between the source region 14S and the drain region 14D is also defined.

Note that it is necessary to clean the exposed portion of the substrate 100 before depositing a gate insulating layer 15 on the substrate 100. The cleaning process prevents foreign substances from contaminating the interface between the gate insulating layer 15 and the active layer 14. The cleaning process involves wet cleaning the substrate 100 with an HF solution before depositing the gate insulating layer 15 onto the substrate 100.

Referring to FIG. 1D, a protective layer 17 is deposited on the entire surface of the substrate 100 including the gate electrode 16. The protective layer 17 is then patterned and etched to form contact holes. The contact holes expose the second source metal line 12S, the source region 14S, the drain region 14D, and the second drain metal line 12D. Next, a transparent conductive layer is deposited on the exposed portion of the substrate 100. The transparent conductive layer is also patterned and etched, and forms a first metal line 18-1, which connects the second source metal line 12S with the source region 14S, and a second metal line 18-2, which connects the second drain metal line 12D with the drain region 14D.

As noted previously, in the prior art, a cleaning process with an HF solution is performed on the exposed portion of the substrate 100 before the gate insulating layer 15 is deposited onto the substrate 100. However, because the first source metal line 11S and the first drain metal line 11D are made from a low resistance metal such as aluminum, the source and drain metal lines are damaged by the cleaning process because of the strong etching properties of the HF cleaning solution.

SUMMARY OF THE INVENTION

To overcome the problems described above, preferred embodiments of the present invention provide a method for manufacturing a thin film transistor where a protective layer is provided to protect source and drain metal lines, which are made from a low resistance metal such as aluminum, from being damaged during a cleaning process.

According to a first preferred embodiment of the present invention, a method of manufacturing a thin film transistor includes the steps of forming source and drain metal lines on an insulating substrate, forming a first protective layer covering the source and drain metal lines, sequentially depositing a buffer layer and a semiconductor layer on the first protective layer, forming an active layer by patterning and etching the semiconductor layer, etching the buffer layer using the active layer as a mask, performing a cleaning process before depositing a gate insulating layer on an exposed entire surface of the substrate, forming a gate insulating layer and a gate electrode on the active layer, forming source and drain regions in the active layer by doping the active layer with impurities using the gate insulating layer as a mask, forming a second protective layer covering the exposed surface of the substrate including the gate electrode, forming contact holes in the first and second protective layers so that the source and drain metal lines and the source and drain regions are exposed, and forming a first metal line connecting the source metal line and the source region, and forming a second metal line connecting the drain metal line and the drain region.

According to a second preferred embodiment of the present invention, a method for manufacturing a thin film transistor includes the steps as described in the first preferred embodiment except that the source and drain regions are formed before forming the gate electrode.

Other features, elements and advantages of the present invention will be described in more detail in the following detailed description of preferred embodiments of the present invention with reference to the attached drawings.

BRIEF DESCRIPTION OF THE ATTACHED DRAWINGS

The present invention will become more fully understood from the detail description given herein below and the accompanying drawings which are given by way of illustration only, and thus do not limit the present invention and wherein.

DETAILED DESCRIPTION OF THE PREFERRED EMBODIMENTS

FIGS. 2A–2D are cross-sectional views illustrating a process for manufacturing a thin film transistor according to a first preferred embodiment of the present invention.

Figure 1A:
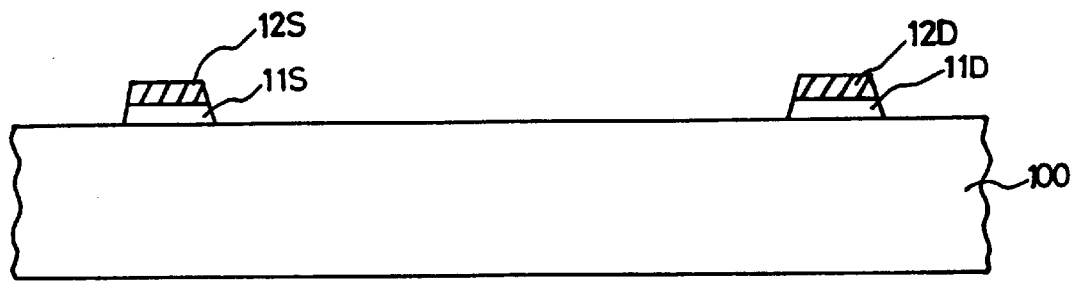
FIGS. 1A–1D are cross-sectional views illustrating a process for manufacturing a thin film transistor according to the prior art.
Figure 1B:
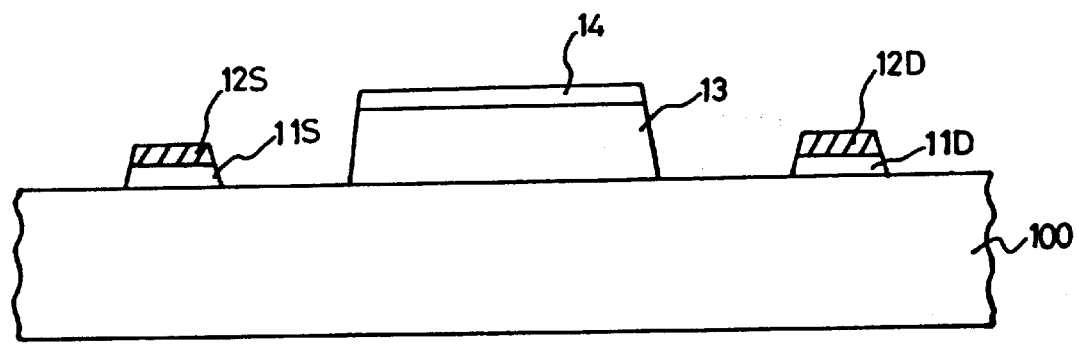
Figure 1C:
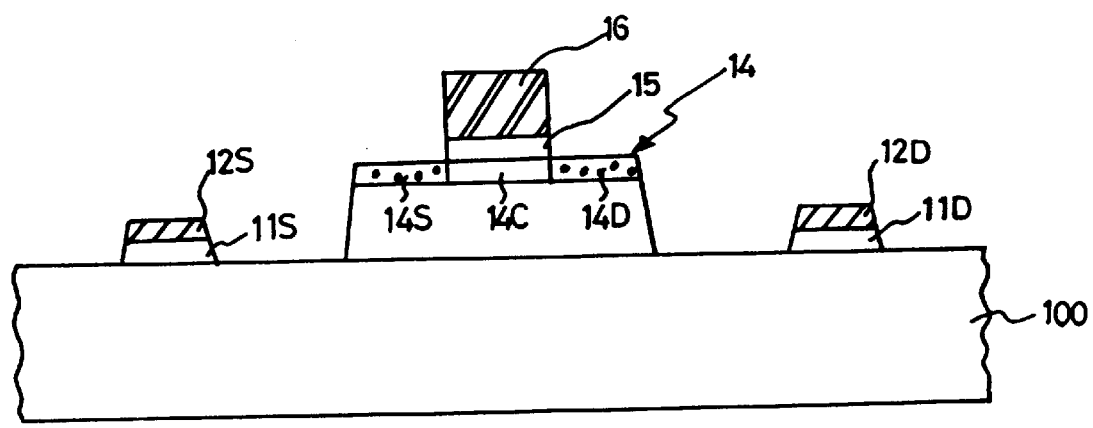
Figure 1D:
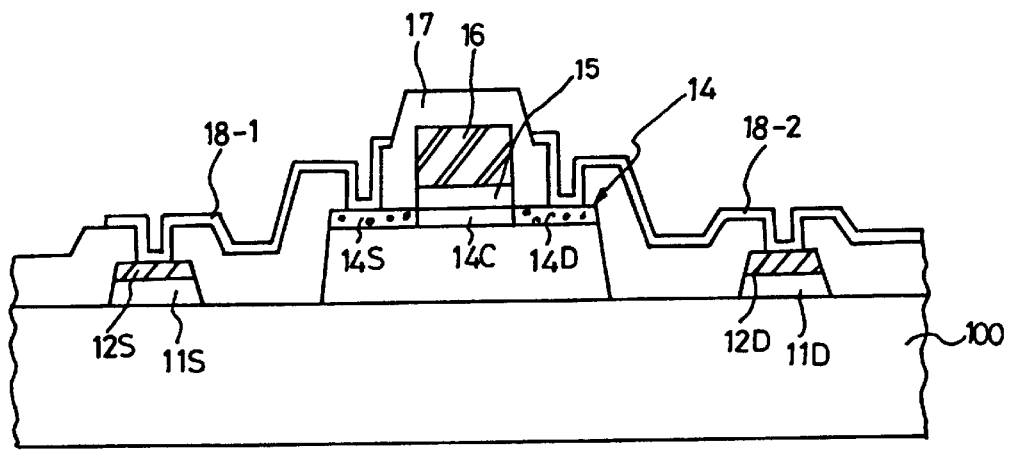
Figure 2A:
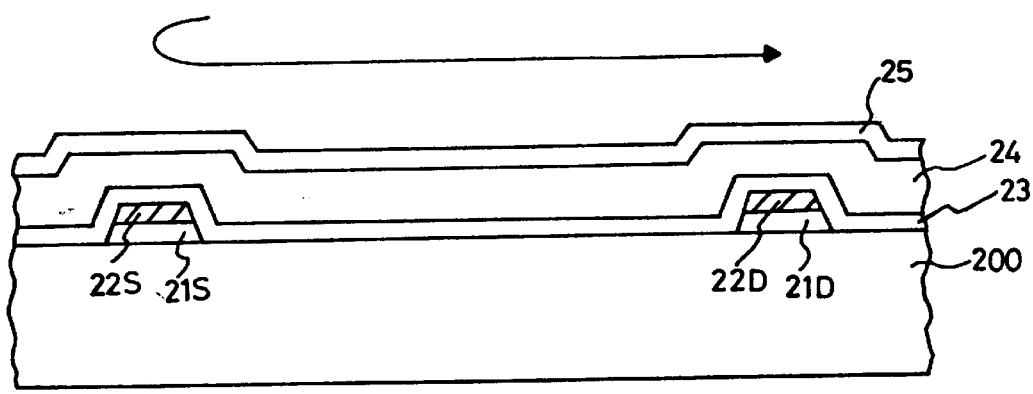
FIGS. 2A–2D are cross-sectional views illustrating a process for manufacturing a thin film transistor according to a first preferred embodiment of the present invention.

Referring to FIG. 2A, source and drain metal lines are formed on an insulating substrate 200. For the insulating substrate 200, a transparent substance such as glass or quartz is preferably used. The source metal line preferably has a double-layered laminate structure including a first source metal line 21S and a second source metal line 22S. The drain metal line preferably has a double-layered laminate structure including a first drain metal line 21D and a second drain metal line 22D.

The first source metal line 21S and the first drain metal line 21D preferably have a thickness in the range of about 2500 to about 3500 angstroms, while the second source metal line 22S and the second drain metal line 22D preferably have a thickness in the range of about 200 to about 1000 angstroms.

In forming the double-layered source and drain metal lines, it is preferred that the first and second conductive layers are sequentially deposited on the insulating layer 200 and then sequentially patterned and etched to form the second source metal line 22S and the second drain metal line 22D first, and then, the first source metal line 21S and the first drain metal line 21D are formed.

Preferably, the first conductive layer is preferably made from a low-resistance, aluminum-based metal, such as Al, AlMo, AlTa, or AlNd or other suitable material. An aluminum-based metal is preferred because it will promote faster signal transmission in devices where the thin film transistor is used, for example, in a liquid crystal display device. The second conductive layer is preferably made from a conductive metal such as Mo, Cr, Ni, Ti, W, MoW, Ta, Al, Ta, AlNd, or other suitable metal.

Thereafter, a metal line protective layer 23 is deposited so as to preferably have a thickness that is less than about 2000 angstroms and to cover the entire surface of the substrate 200. Next, a buffer layer 24 is deposited so as to preferably have a thickness in the range of about 3000 to about 4000 angstroms. The buffer layer 24 may be formed by depositing silicon oxide or silicon nitride using the APCVD or PECVD process. Next, an amorphous silicon thin film is then deposited so as to preferably have a thickness in the range of about 400 to about 1000 angstroms, on the buffer layer 24. The amorphous silicon thin film is then crystallized into a polysilicon thin film 25 using a laser annealing process or other suitable process.

The protecting layer 23 covers the source and drain metal lines so that the source and drain metal lines are protected against damage during a cleaning process, which is performed prior to depositing a gate insulating layer. The buffer layer 24 is provided so that foreign substances in the insulating substrate 200 do not penetrate into the silicon thin film during crystallization of the thin film. The buffer layer 24, thus, prevents defects from arising in the silicon thin film's crystalline structure.

It is preferable that the buffer layer 24 be formed from a different material than that which forms the protecting layer 23. For example, if the buffer layer 24 is formed from silicon oxide, then the protecting layer 23 should preferably be formed from silicon nitride. This is preferred because, if the silicon nitride forms the protecting layer 23, the protecting layer 23 can be used for etching prevention when etching the buffer layer 24.

Figure 2B:
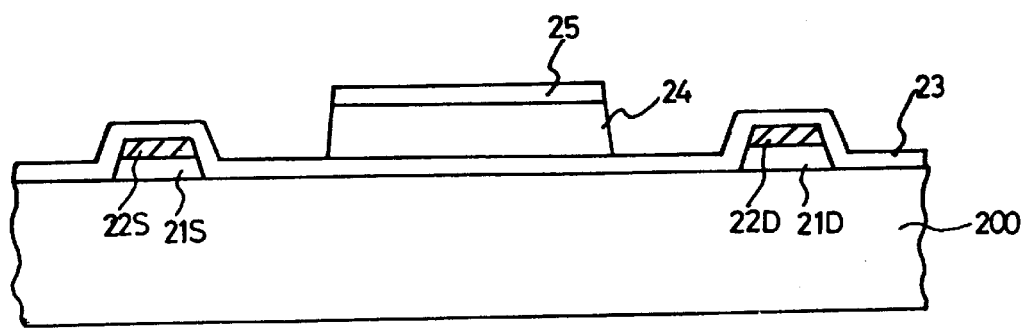

Referring to FIG. 2B, the polysilicon thin film 25 is patterned and etched to form an active layer 25. Next, the buffer layer 24 is etched with the active layer 25 acting as a mask so that the etched buffer layer 24 and the active layer 25 have the same pattern. Note that as shown in FIG. 2B, the source metal lines 21S and 22S and the drain metal lines 21D and 22D remain covered by the protecting layer 23.

Figure 2C:
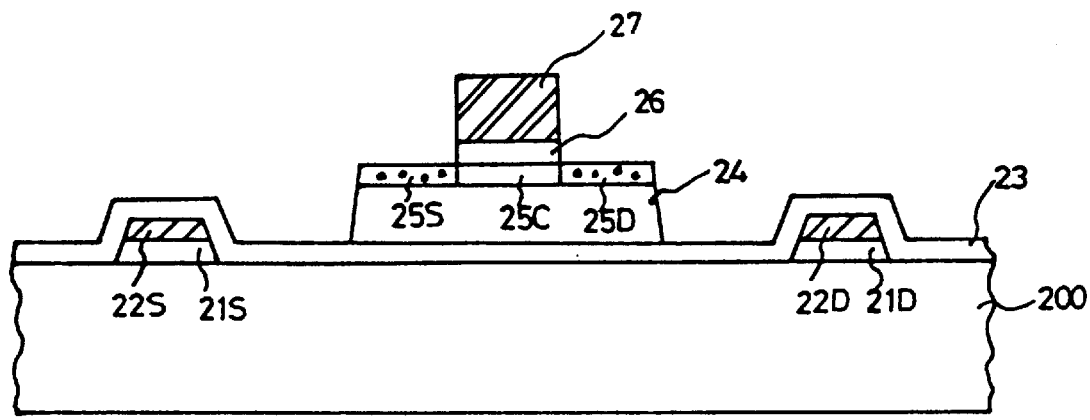

Referring to FIG. 2C, before depositing the gate insulating layer 26, the exposed portion of the substrate 200 undergoes a cleaning process which uses an HF cleaning solution. The cleaning process is performed to enhance the interfacial characteristic between the active layer 25 and the gate insulating layer 26. Note that the metal line protecting layer 23, protects the source and drain metal lines against the HF cleaning solution by preventing it from encroaching into the source and drain metal lines. Note also that the best protection against encroachment by the cleaning solution is if the protecting layer 23 is formed from silicon nitride.

Next, a gate insulating layer preferably having a thickness in the range of about 1000 to about 1500 angstroms, and a conductive layer having a thickness in the range of about 2000 to about 4000 angstroms are sequentially deposited on the exposed surface of the substrate 200. The conductive layer may be a single-layered or double-layered structure preferably made from known metals such as Al, Mo, Cr, Ti, Ta, or MoW or other suitable metals. Similarly, the gate insulating layer 26 is preferably made from known insulating materials such as silicon oxide or silicon nitride.

The conductive layer is patterned and etched to form a gate electrode 27. Thereafter, the gate insulating layer is etched with the gate electrode 27 functioning as a mask. Reference numeral 26 denotes the etched gate insulating layer. Next, the entire surface of the substrate 200 is heavily doped with impurities to create impurity regions in the active layer 25. These impurity regions form a source region 25S and a drain region 25D. During the doping process, the gate electrode 27 functions as a mask, so that after the doping process, between the source region 25S and drain region 25D, a channel region 25C exists.

Figure 2D:
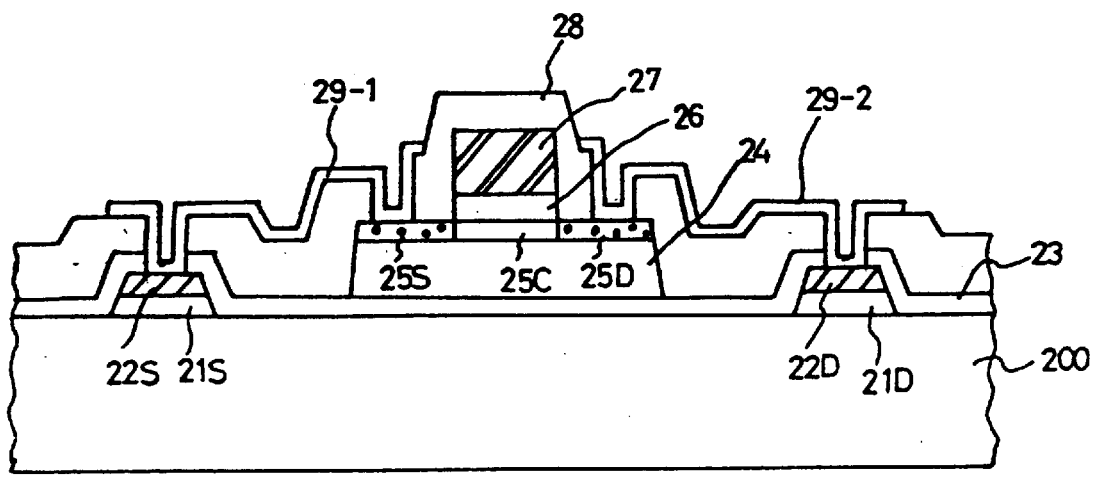

Referring to FIG. 2D, a protective layer 28, which protects the gate electrode 27 and the active layer 25, is formed so as to preferably have a thickness of about 2000 to about 6000 angstroms. The protective layer 28 and the protecting layer 23 are then patterned and etched to form contact holes. Patterning the contact holes result in exposing the second source metal line 22S, the second drain metal line 22D, the source region 25S and the drain region 25D. Note that in the preferred embodiments, the metal line protective layer 23 preferably has a thickness that is a little less than about 2000 angstroms so that an excessive step difference does not exist in the protective layer 28.

Next, a transparent conductive layer is formed on the exposed portion of the substrate 200, and then patterned and etched so that a first metal line 29-1 connects the second source metal line 22S with the source region 25S, and a second metal line 29-2 connects the second drain metal line 22D with the drain region 25D. Alternatively, instead of a transparent conductor, other known metal conductors can be used to form the first and second metal lines 29-1 and 29-2.

Note that where the thin film transistor of the present invention is used to make a liquid crystal display device, the source metal line is used to form a data line and the second metal line is used to form a pixel electrode.

Alternatively, it is possible to form the second metal line so that it is only connected to the drain region 25D so that no drain metal line is formed.

Figure 3A:
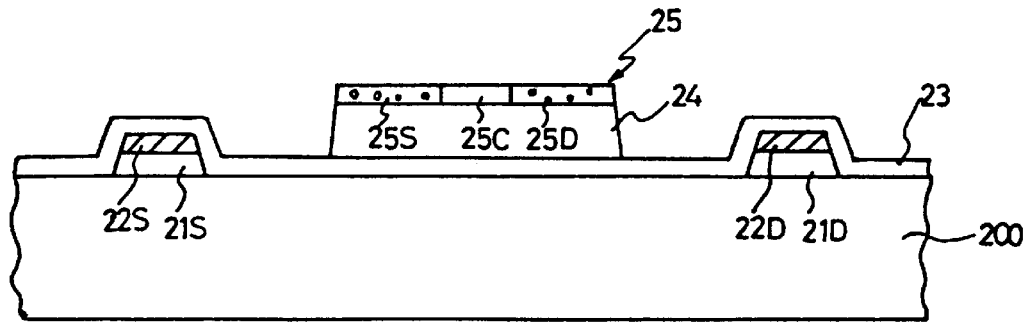
FIGS. 3A–3C are cross-sectional views illustrating a process for manufacturing a thin film transistor according to a second preferred embodiment of the present invention.
Figure 3B:
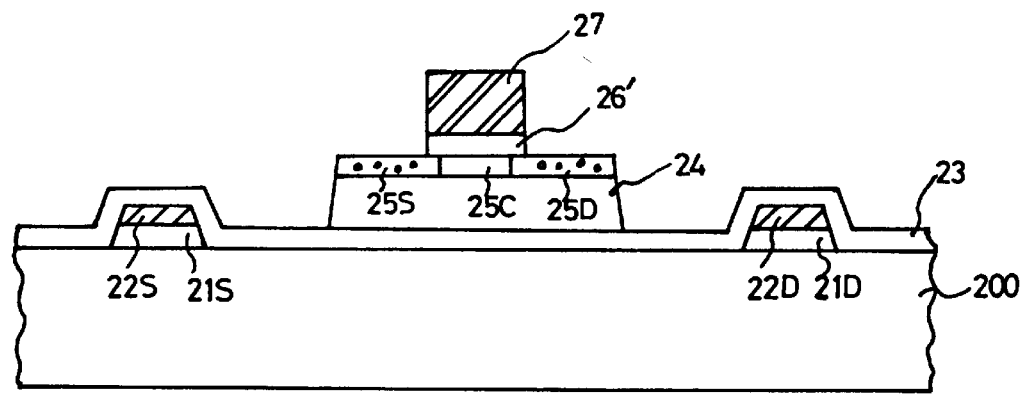
Figure 3C:
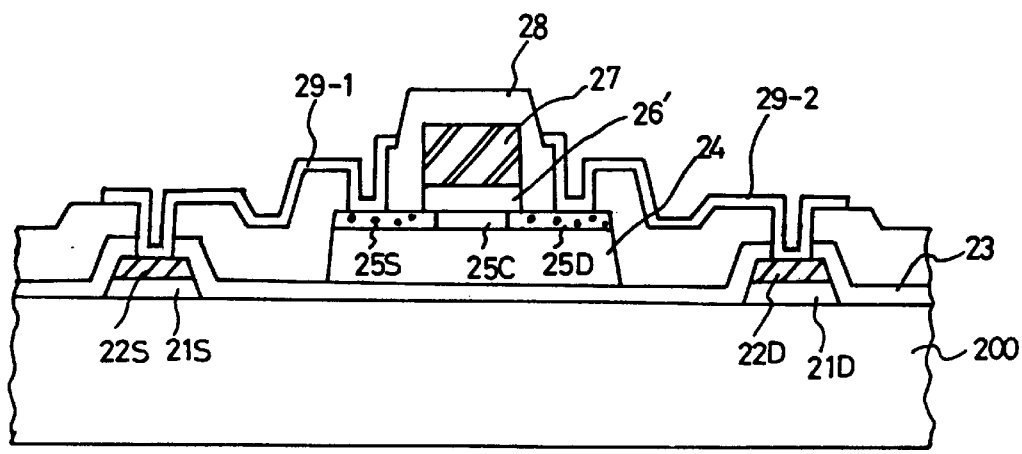

FIGS. 3A–3C are cross-sectional views illustrating a process for manufacturing a thin film transistor according to a second preferred embodiment of the present invention. The method in the second preferred embodiment is the same as the method used in the first preferred embodiment except, here, the source and drain region are formed before forming the gate electrode.

Referring to FIG. 3A, note that the method for manufacturing a thin film transistor in the second preferred embodiment is similar to the method according to the first preferred embodiment described above, up to and including the steps of forming an active layer 25 by patterning and etching a polysilicon thin film, and then etching a buffer layer 24 using the active layer 25 as a mask.

But in the second preferred embodiment, before a gate electrode is formed, the exposed active layer 25 is heavily doped with impurities in select areas to form the source region 25S and drain region 25D as well as the channel region 25C. But, because the doping damages the active layer 25, a laser annealing process is preferably used to activate the active layer 25.

Referring to FIG. 3B, a cleaning process preferably using an HF cleaning solution is performed prior to the deposition of a gate insulating layer 26'. Note that it is possible in the preferred embodiments to prevent the source metal lines 21S and 22S and the drain metal lines 21D and 22D from being damaged by the HF cleaning solution even when the source and drain metal lines are formed from a material such as aluminum (Al). This is possible because the metal line protective layer 23 protects the source and drain metal lines against damage by the HF cleaning solution.

Next, the gate insulating layer 26' and a conductive layer are sequentially deposited on the exposed portion of the substrate 200 and the active layer 25. The conductive layer is patterned and etched to form the gate electrode 27. Note that as shown in FIG. 3B, it is possible to make an overlapping type of thin film transistor where the gate electrode 27 overlaps in select areas with the source and drain regions 25S and 25D, and yet still retain good on-current characteristics.

Referring to FIG. 3C, in the second preferred embodiment, the process after forming the gate electrode 27 is the same as the process in the first preferred embodiment that references FIG. 2D.

Note that according to the second preferred embodiment of the present invention, the step of crystallizing the amorphous silicon is preferably performed separately from the step of activating the active layer after doping it with impurities. Alternatively, however, the crystallization of the amorphous silicon and the activation of the active layer may be performed simultaneously by forming the active layer with amorphous silicon and doping the active layer with impurities while the active layer remains in an amorphous silicon state, and then performing a single step of laser annealing. Thus, in the second preferred embodiment, the step of laser-based crystallization can be omitted.

As described above, at least one advantage of the present invention is that it is possible to prevent the source and drain metal lines from being damaged during the cleaning process by forming a protective layer that protects the source and drain metal lines. Therefore, the cleaning process can be performed without damaging the source and drain metal lines while enhancing the interfacial characteristics of the active layer and the gate insulating layer.

While the invention has been particularly shown and described with reference to preferred embodiments thereof, it will be understood by those skilled in the art that the foregoing and other changes in form and details may be made therein without departing from the spirit and slope of the invention.

What is claimed is:

1. A method for manufacturing a thin film transistor, the method comprising:

forming source and drain metal lines on an insulating substrate;

forming a first protective layer covering the source and drain metal lines;

sequentially depositing a buffer layer and a semiconductor layer on the first protective layer;

forming an active layer by patterning and etching the semiconductor layer;

etching the buffer layer using the active layer as a mask;

performing a cleaning process before depositing a gate insulating layer on an exposed surface of the substrate;

forming the gate insulating layer and a gate electrode on the active layer;

forming source and drain regions in the active layer by doping the active layer with impurities using the gate insulating layer as a mask;

forming a second protective layer covering the exposed entire surface of the substrate including the gate electrode;

forming contact holes in the first and second protective layers, thereby exposing the source and drain metal lines and the source and drain regions; and forming a first metal line connecting the source metal line and the source region, and a second metal connecting the drain metal line and the drain region.

2. The method according to claim 1, wherein the cleaning process is performed with an HF cleaning solution.

3. The method according to claim 1, further comprising the step of crystallizing the semiconductor layer.

4. The method according to claim 3, further comprising the step of activating the active layer after doping the active layer with the impurities.

5. The method according to claim 1, further comprising the step of activating the active layer after doping the active layer with the impurities.

6. The method according to claim 1, wherein the first protective layer and the buffer layer are made of different materials.

7. The method according to claim 6, wherein the first protective layer is made of silicon nitride and the buffer layer is made of silicon oxide.

8. The method according to claim 1, wherein the source metal line has a double-layered laminate structure including a first source metal line and a second source metal line and wherein the drain metal line has a double-layered laminate structure including a first rain metal line and a second drain metal line.

9. The method according to claim 8, wherein said first source metal line is made from at least one of Al, AlMo, AlTa, and AiNd, wherein said second source metal line is made from at least one of Mo, Cr, Ni, Ti, W, MoW, Ta, Al, Ta, and AlNd, wherein said first drain metal line is made from at least one of Al, AlMo, AlTa, and AlNd, and wherein said second drain metal line is made from at least one of Mo, Cr, Ni, Ti, W, MoW, Ta, Al, Ta, and AlNd.

10. A method for manufacturing a thin film transistor comprising the steps of:

forming source and drain metal lines on an insulating substrate;

forming a first protective layer covering the source and drain metal lines;

sequentially depositing a buffer layer and a semiconductor layer on the first protective layer;

forming an active layer by patterning and etching the semiconductor layer;

etching the buffer layer using the active layer as a mask;

forming source and drain regions in the active layer by selectively doping the active layer with impurities;

performing a cleaning process before depositing a gate insulating layer on an exposed entire surface of the substrate;

forming the gate insulating layer and a gate electrode on the active layer;

forming a second protective layer covering the exposed surface of the substrate including the gate electrode;

forming contact holes in the first and second protective layers so that the source and drain metal lines and the source and drain regions are exposed; and forming a first metal line connecting the source metal line and the source region, and a second metal line connecting the drain metal line and the drain region.

11. The method according to claim 10, wherein the cleaning process is performed with an HF cleaning solution.

12. The method according to claim 10, further comprising the step of crystallizing the semiconductor layer.

13. The method according to claim 12, further comprising the step of activating the active layer after doping the active layer with the impurities.

14. The method according to claim 10 further comprising the step of activating the active layer after doping the active layer with the impurities.

15. The method according to claim 10, further comprising the step of performing a laser annealing process for simultaneously activating and crystallizing the active layer, after doping the active layer with the impurities.

16. The method according to claim 10, wherein the first protective layer and the buffer layer are made of different materials.

17. The method according to claim 16, wherein the first protective layer is made of silicon nitride and the buffer layer is made of silicon oxide.

18. The method according to claim 10, wherein the source metal line has a double-layered laminate structure including a first source metal line and a second source metal line and wherein the drain metal line has a double-layered laminate structure including a first drain metal line and a second drain metal line.

19. The method according to claim 18, wherein said first source metal line is made from at least one of Al, AlMo, AlTa, and AlNd, wherein said second source metal line is made from at least one of Mo, Cr, Ni, Ti, W, MoW, Ta, Al, Ta, and AlNd, wherein said first drain metal line is made from at least one of Al, AlMo, AlTa, and AlNd, and wherein said second drain metal line is made from at least one of Mo, Cr, Ni, Ti, W, MoW, Ta, Al, Ta, and AlNd.

20. A method for manufacturing a thin film transistor comprising the steps of:

forming source and drain metal lines of an insulating substrate; and forming a first protective layer covering the source and drain metal lines prior to cleaning the substrate and forming a gate electrode.

21. The method according to claim 20, further comprising the step of sequentially depositing a buffer layer and the semiconductor layer on the first protective layer.

22. The method according to claim 21, further comprising the step of forming an active layer by patterning and etching the semiconductor layer.

23. The method according to claim 22, further comprising the step of crystallizing the semiconductor layer.

24. The method according to claim 23, further comprising the step of activating the active layer after doping the active layer with the impurities.

25. The method according to claim 22, further comprising the step of activating the active layer after doping the active layer with the impurities.

26. The method according to claim 22, further comprising the step of etching the buffer layer using the active layer as a mask.

27. The method according to claim 26, further comprising the step of performing a cleaning process before depositing a gate insulating layer on an exposed surface of the substrate.

28. The method according to claim 27, wherein the step of performing a cleaning process further includes the step of using an HF cleaning solution.

29. The method according to claim 27, further comprising the step of forming a gate insulating layer and a gate electrode on the active layer.

30. The method according to claim 29, further comprising the step of forming source and drain regions in the active layer by doping the active layer with impurities using the gate insulating layer as a mask.

31. The method according to claim 30, further comprising the step of forming a second protective layer covering the exposed entire surface of the substrate including the gate electrode.

32. The method according to claim 21, further comprising the step of forming contact holes in the first and second protective layers, thereby exposing the source and drain metal lines and the source and drain regions.

33. The method according to claim 32, further comprising the step of forming a first metal line connecting the source metal line and the source region, and a second metal line connecting the drain metal line and the drain region.

34. The method according to claim 26, further comprising the step of forming source and drain regions in the active layer by selectively doping the active layer with impurities.

35. The method according to claim 34, further comprising the step of performing a cleaning process before depositing a gate insulating layer on an exposed surface of the substrate.

36. The method according to claim 35, further comprising the step of forming a gate insulating layer and a gate electrode on the active layer.

37. The method according to claim 36, further comprising the step of forming a second protective layer covering the exposed entire surface of the substrate including the gate electrode.

38. The method according to claim 37, further comprising the step of forming contact holes in the first and second protective layers, thereby exposing the source and drain metal lines and the source and drain regions.

39. The method according to claim 38, further comprising the step of forming a first metal line connecting the source metal line and the source region, and a second metal line connecting the drain metal line and the drain region.

40. The method according to claim 34, further comprising the step of performing a laser annealing process for simultaneously activating and crystallizing the active layer, after doping the active layer with the impurities.

41. The method according to claim 20, wherein the first protective layer and the buffer layer are made of different materials.

42. The method according to claim 41, wherein the first protective layer is made of silicon nitride and the buffer layer is made of silicon oxide.

43. The method according to claim 20, wherein the source metal line has a double-layered laminate structure including a first source metal line and a second source metal line and wherein the drain metal line has a double-layered laminate structure including a first drain metal line and a second drain metal line.

44. The method according to claim 43, wherein said first source metal line is made from at least one of Al, AlMo, AlTa, and AlNd, wherein said second source metal line is made from at least one of Mo, Cr, Ni, Ti, W, MoW, Ta, Al, Ta, and AlNd, wherein said first drain metal line is made from at least one of Al, AlMo, AlTa, and AlNd, and wherein said second drain metal line is made from at least one of Mo, Cr, Ni, Ti, W, MoW, Ta, Al, Ta, and AlNd.

* * * * *